United States Patent
Yuan et al.

(10) Patent No.: US 8,843,869 B1
(45) Date of Patent: Sep. 23, 2014

(54) VIA INSERTION IN INTEGRATED CIRCUIT (IC) DESIGNS

(71) Applicant: GLOBALFOUNDRIES Inc., Grand Cayman (KY)

(72) Inventors: Lei Yuan, Cupertino, CA (US); Jongwook Kye, Pleasanton, CA (US); Harry Levinson, Saratoga, CA (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 13/838,378

(22) Filed: Mar. 15, 2013

(51) Int. Cl.
*G06F 17/50* (2006.01)

(52) U.S. Cl.
CPC .................................. *G06F 17/5077* (2013.01)
USPC ............................ 716/130; 716/126; 716/129

(58) Field of Classification Search
USPC ......... 716/118–119, 122, 126, 129–130, 132, 716/135
See application file for complete search history.

(56) References Cited

U.S. PATENT DOCUMENTS

| | | | |
|---|---|---|---|
| 2004/0255258 A1* | 12/2004 | Li ..................................... | 716/8 |
| 2007/0101307 A1* | 5/2007 | Ueda ................................ | 716/10 |
| 2007/0130553 A1* | 6/2007 | Wang et al. ...................... | 716/11 |
| 2007/0162882 A1* | 7/2007 | Ueda ................................ | 716/13 |
| 2007/0174801 A1* | 7/2007 | Park et al. ......................... | 716/8 |
| 2011/0014786 A1* | 1/2011 | Sezginer et al. ............... | 438/618 |
| 2011/0023002 A1* | 1/2011 | Cheng et al. ................... | 716/126 |
| 2011/0055789 A1* | 3/2011 | Chakanaker et al. ......... | 716/130 |
| 2011/0113393 A1* | 5/2011 | Sezginer ....................... | 716/106 |
| 2011/0214100 A1* | 9/2011 | McElvain ..................... | 716/130 |
| 2012/0131534 A1* | 5/2012 | Pekarek ........................ | 716/122 |
| 2012/0180014 A1* | 7/2012 | Fang et al. .................... | 716/112 |
| 2012/0317531 A1* | 12/2012 | Sundaresan ................... | 716/115 |
| 2013/0283224 A1* | 10/2013 | Lin et al. ...................... | 716/113 |
| 2013/0292772 A1* | 11/2013 | Ma et al. ...................... | 257/368 |

* cited by examiner

*Primary Examiner* — Stacy Whitmore
(74) *Attorney, Agent, or Firm* — Ditthavong & Steiner, P.C.

(57) ABSTRACT

A method and apparatus for insertion of a via improving a manufacturability of a resulting device while ensuring compliance with DRC rules are disclosed. Embodiments include: determining a layer of a substrate of an IC design having a first via and a plurality of routes, the plurality of routes extending horizontally on the substrate and placed on one of a plurality of equally spaced vertical positions; comparing a region of the layer extending vertically between a first set of the plurality of routes and extending horizontally between a second set of the plurality of routes with one or more threshold values, the region being adjacent to the first via and being separated from the plurality of routes; and inserting a second via based on the comparison.

20 Claims, 11 Drawing Sheets

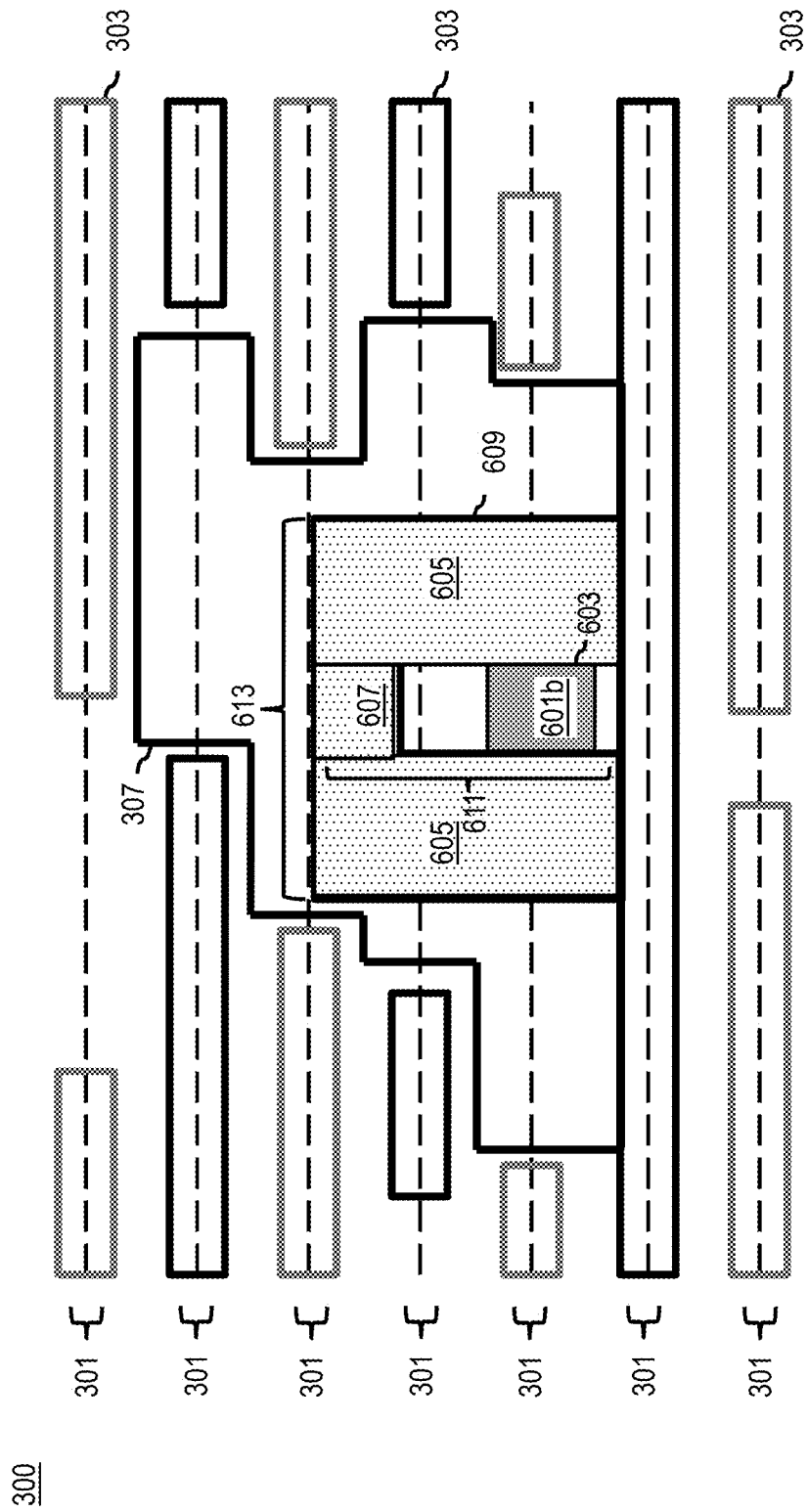

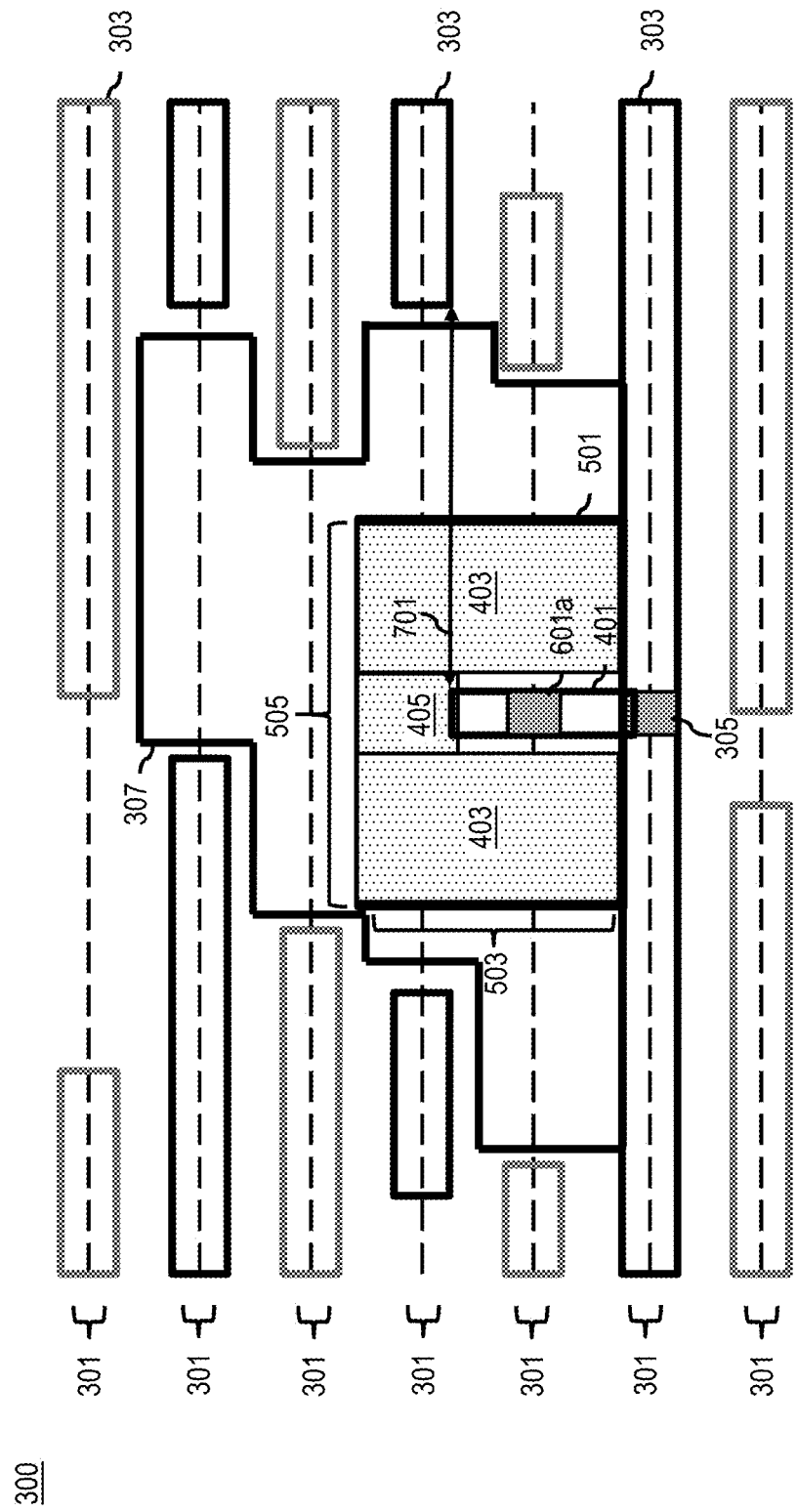

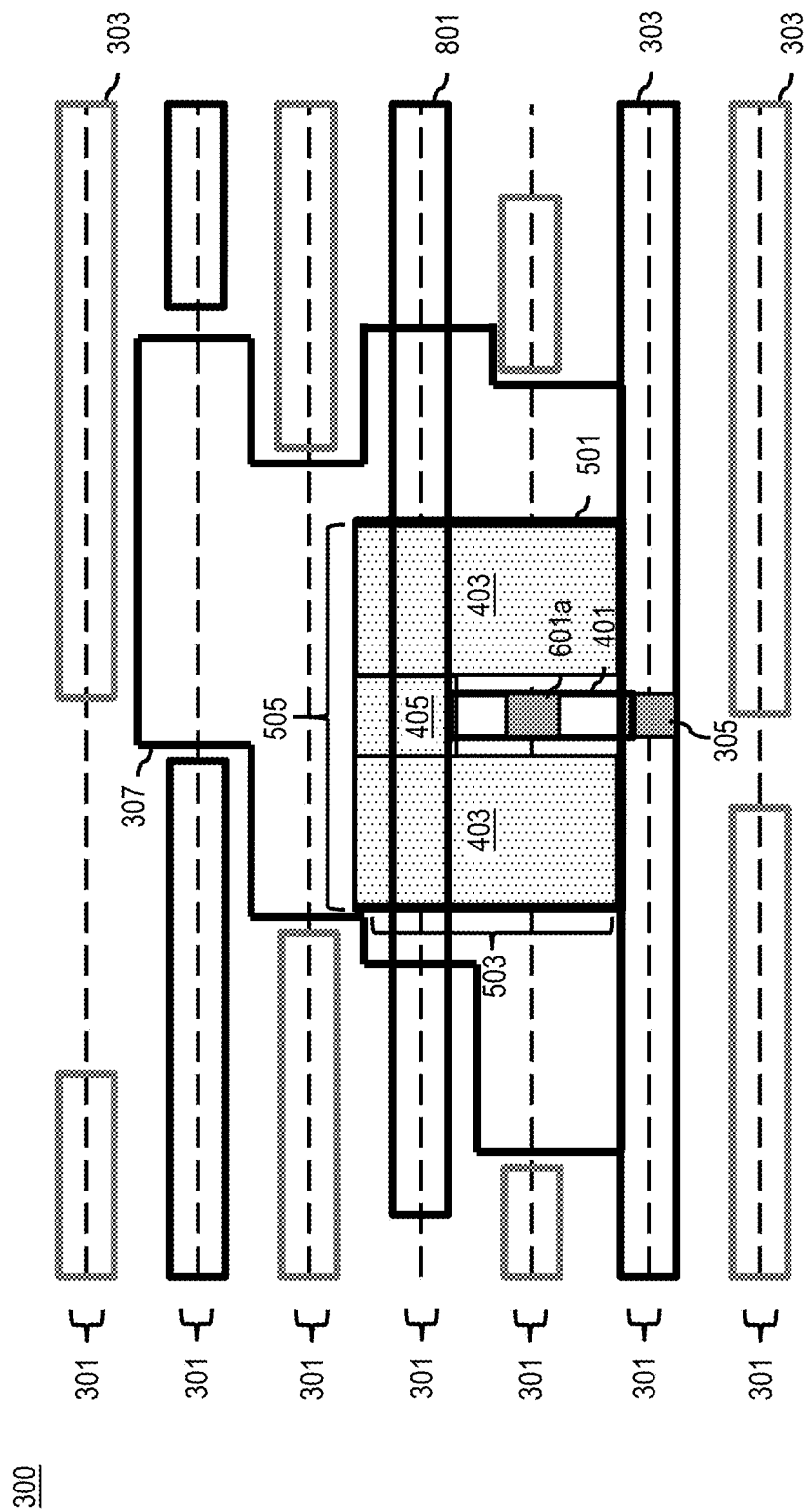

VIA INSERTION IN INTEGRATED CIRCUIT (IC) DESIGNS

TECHNICAL FIELD

The present disclosure relates to an insertion of vias in IC designs. The present disclosure is particularly applicable for insertions of vias or via bars into IC designs utilizing self aligned double patterning (SADP) or sidewall image transfer (SIT) technology.

BACKGROUND

In a fabrication of IC designs, particularly a fabrication of IC designs using SADP technology, vias are typically placed to connect layers, for instance 'metal 1' (M1) and 'metal 2' (M2) layers. Such, vias are frequently sized and positioned early in a design process to efficiently utilize space on an IC design and to obtain adequate performance, reliability, and manufacturability of the resulting device. Additional vias may be inserted, at later steps in the design process (e.g., after placement and routing (P&R), after decomposition) to improve performance, reliability, and manufacturability of the resulting device. However, to ensure a manufacturability of a resulting device, traditional processes require complex two-dimensional design rule checks (DRCs) that slow down the runtime of standard IC design tools, such as DRC engines and automated routers, which increases the overall design cycle time. Furthermore, traditional DRCs may be color dependent and thus require decomposition information such as whether a feature is a mandrel or non-mandrel metal and tip-to-tip, side-to-tip, and side-to-side distances.

A need therefore exists for methodology and an apparatus enabling an insertion of vias that ensures a manufacturability of a resulting device without a complex two-dimensional DRC and is color independent.

SUMMARY

An aspect of the present disclosure is a method of determining a region to insert a (redundant or replacement) via by, inter alia, comparing a region adjacent to an existing via and separated from existing routes with one or more threshold values.

An aspect of the present disclosure is an apparatus configured to determine a region to insert a (redundant or replacement) via by, inter alia, comparing a region adjacent to an existing via and separated from existing routes with one or more threshold values.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: determining a layer of a substrate of an IC design having a first via and a plurality of routes, the plurality of routes extending horizontally on the substrate and placed on one of a plurality of equally spaced vertical positions; comparing a region of the layer extending vertically between a first set of the plurality of routes and extending horizontally between a second set of the plurality of the routes with one or more threshold values, the region being adjacent to the first via and being separated from the plurality of routes; and inserting a second via based on the comparison.

Some aspects include a method, wherein the one or more threshold values include a predetermined height and width and the comparison further includes: determining a rectangular region adjacent to the first via and extending at least the predetermined height from an outer edge of the first via, the rectangular region having a width of at least the predetermined width; and comparing the region with the rectangular region, wherein the second via is inserted in the rectangular region and based further on the comparison of the region with the rectangular region. Additional aspects include a method, wherein the rectangular region extends the predetermined height from the outer edge and the width equals the predetermined width. Further aspects include: determining a vertical distance between an outer edge of the first via and one of the first set of routes; determining a first horizontal distance between a horizontal midpoint of the first via and one of the second set of routes along a first horizontal direction; and determining a second horizontal distance between the horizontal midpoint of the first via and one of the second set of routes along the other horizontal direction, wherein the region is at least a portion of a rectangular region extending vertically by the vertical distance from the outer edge of the first via and having a width equal to the sum of the first and second horizontal distances. Some aspects include a method, wherein the one or more threshold values includes a predetermined height and width, and the comparison further comprises including: comparing the vertical distance with the predetermined height; and comparing the first and second horizontal distances with the predetermined width, wherein the second via is inserted in the rectangular region and based further on the comparison of the vertical distance with the predetermined height and the comparison of the first and second horizontal distances with the predetermined width. Additional aspects include determining a size of the second via based on a size of the rectangular region. Further aspects include a method, wherein the layer is a M1 or M2 layer of the IC design and the first and second vias are a connection between the layer and another layer of the IC design, a pin access, or a metal transition region. Some aspects include: determining a minimum region for inserting the second via; and determining a critical distance associated with a mask generating the route, the first via, the second via, or a combination thereof, wherein the one or more threshold values are based on the minimum region and the critical distance.

Another aspect of the present disclosure is a apparatus including: at least one processor; and at least one memory including computer program code for one or more programs, the at least one memory and the computer program code configured to, with the at least one processor, cause the apparatus to perform at least the following, determine a layer on a substrate of an IC design having a first via and a plurality of routes, the plurality of routes extending horizontally on the substrate and placed on one of a plurality of equally spaced vertical positions; compare a region of the layer extending vertically between a first set of the plurality of routes and extending horizontally between a second set of the plurality of the routes with one or more threshold values, the region being and adjacent to the first via and being separated from the plurality of routes; and insert a second via based on the comparison.

Aspects include an apparatus, wherein the one or more threshold values include a predetermined height and width and the comparison further includes: determining a rectangular region adjacent to the first via and extending at least the predetermined height from an outer edge of the first via, the rectangular region having a width of at least the predetermined width; and comparing the region with the rectangular region, wherein the second via is inserted in the rectangular region and based further on the comparison of the region with the rectangular region. Some aspects include an apparatus, wherein the rectangular region extends the predetermined height from the outer edge and the width equals the predetermined width. Additional aspects include an apparatus caused to: determine a vertical distance between an outer edge of the first via and one of the first set of routes; determine a first horizontal distance between a horizontal midpoint of the first via and one of the second set of routes along a first horizontal direction; and determine a second horizontal distance between the horizontal midpoint of the first via and one of the second set of routes along the other horizontal direction, wherein the region is at least a portion of a rectangular region extending vertically the vertical distance from the outer edge of the first via having a width of the first and second horizontal distances. Further aspects include an apparatus, wherein the one or more threshold values includes a predetermined height and width, and the comparison further includes: comparing the vertical distance with the predetermined height; and comparing the first and second horizontal distances with the predetermined width, wherein the second via is inserted in the rectangular region and based further on the comparison of the vertical distance with the predetermined height and the comparison of the first and second horizontal distances with the predetermined width. Some aspects include an apparatus caused to determine a size of the second via based on a size of the rectangular region. Additional aspects include an apparatus, wherein the layer is a M1 or M2 layer of the IC design and the first and second vias are a connection between the layer and another layer of the IC design, a pin access, or a metal transition region. Further aspects include an apparatus further caused to: determine a minimum region for inserting the second via; and determine a critical distance associated with a mask generating the route, the first via, the second via, or a combination thereof, wherein the one or more threshold values are based on the minimum region and the critical distance.

Another aspect of the present disclosure is a method including: determining a M1 or M2 layer on a substrate of an IC design having a first via and a plurality of routes, the plurality of routes extending horizontally on the substrate and placed on one of a plurality of equally spaced vertical positions being separated by a distance, and the first via being a connection between the M1 or M2 layer and another M1 or M2 layer of the IC design, a pin access, or a metal transition region; determining a first region of the M1 or M2 layer extending vertically between a first set of the plurality of routes and extending horizontally between a second set of the plurality of the routes for inserting a second via, the region being adjacent to the first via with one or more threshold values and being separated from the plurality of routes; determining a minimum region for inserting the second via; determining a critical distance associated with a mask generating the route, the first via, the second via, or a combination thereof; determining a predetermined height and width based on the minimum region and the critical distance; comparing the first region with the predetermined height and width; and inserting the second via in the region based on the comparison.

Aspects include: determining a rectangular region adjacent to the first via and extending the predetermined height from an outer edge of the first via, the rectangular region having a width of the predetermined width; and comparing the first region with the rectangular region, wherein the second via is inserted in the rectangular region and based further on the comparison of the region with the rectangular region. Some aspects include: determining a vertical distance between an outer edge of the first via and one of the first set of routes; determining a first horizontal distance between a horizontal midpoint of the first via and one of the second set of routes along a first horizontal direction; determining a second horizontal distance between the horizontal midpoint of the first via and one of the second set of routes along the other horizontal direction, wherein the region is a rectangular region extending vertically the vertical distance from the outer edge of the first via and having a width of the first and second horizontal distances; comparing the vertical distance with the predetermined height; and comparing the first and second horizontal distances with the predetermined width, wherein the insertion of the second via is further based on the comparison of the vertical distance with the predetermined height and the comparison of the first and second horizontal distances with the predetermined width. Further aspects include determining a size of the second via based on a size of the rectangular region.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 4 through 5 and 6B illustrate a process to insert a replacement via in accordance with an exemplary embodiment;

FIGS. 4 through 5, 6A, 7, and 8 illustrate a process to insert a redundant mandrel metal via in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of difficult manufacturability of devices resulting from IC designs utilizing vias, particularly in IC designs utilizing vias inserted during a P&R step and/or utilizing complex two-dimensional DRC checks, to connect SADP routes. In accordance with embodiments of the present disclosure, a via is inserted during (or after) a P&R step without (or with) decomposition based on a comparison of a region adjacent to an existing via and separated from existing routes with threshold values.

Methodology in accordance with embodiments of the present disclosure includes: determining a layer of a substrate of an IC design having a first via and a plurality of routes, the plurality of routes extending horizontally on the substrate and placed on one of a plurality of equally spaced vertical positions; comparing a region of the layer extending vertically between a first set of the plurality of routes and extending horizontally between a second set of the plurality of the routes with one or more threshold values, the region being adjacent to the first via and being separated from the plurality of routes; and inserting a second via based on the comparison.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
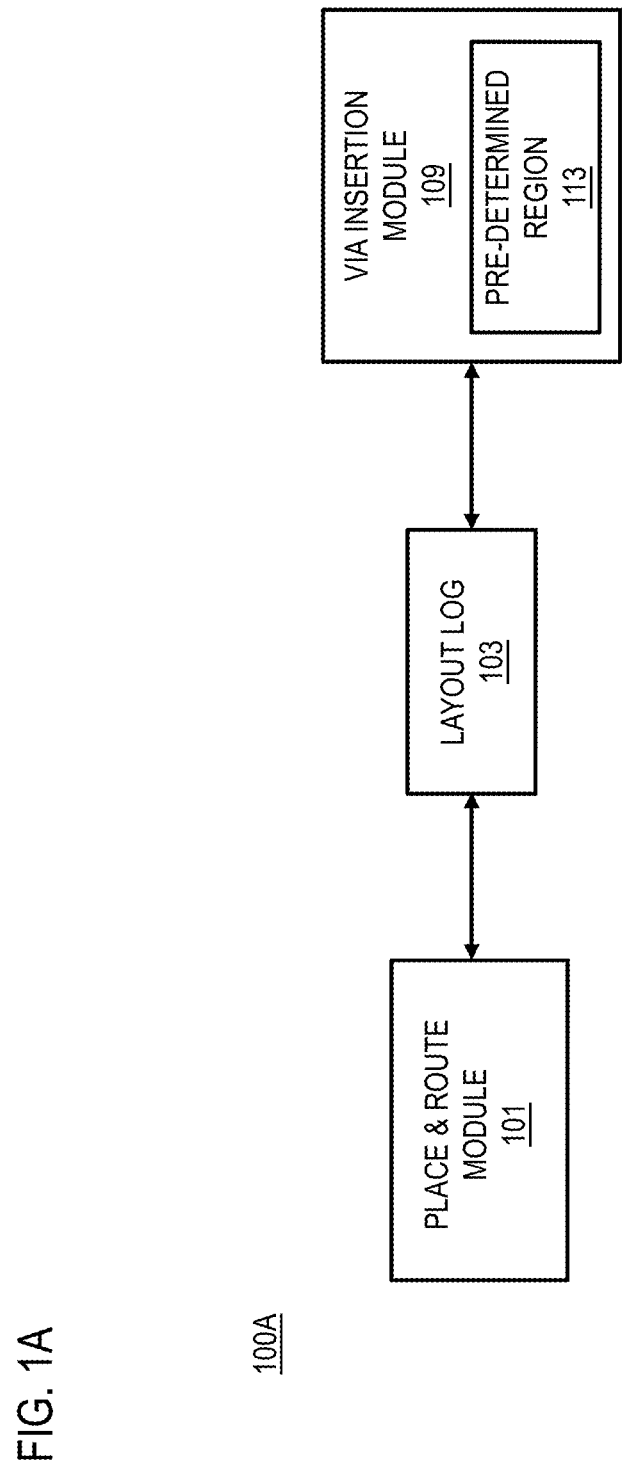
FIGS. 1A and 1B are system diagrams using various modules configured to insert a via in accordance with exemplary embodiments.
Figure 1B:
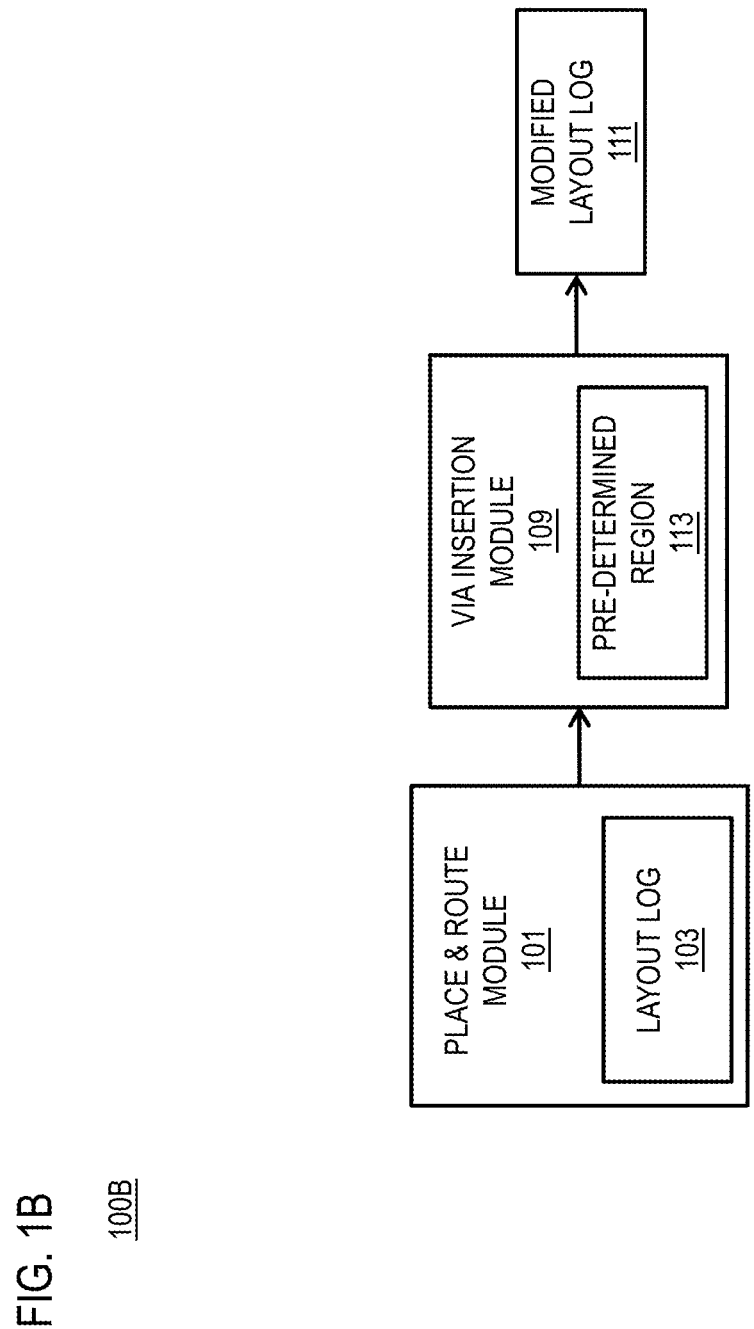

FIGS. 1A and 1B illustrate systems 100A and 100B, respectively, that include a P&R module 101 having access to layout log 103, and a via insertion module 109 having access to a pre-determined region 113. Additionally, system 100B of FIG. 1B optionally includes a modified layout log 111. Modules 101 and 109 may be combined. The log 103 may be combined with log 111, and may be combined or separated from modules 101 and 109 and/or may be accessible by a combination of modules 101 and 109.

P&R module 101 is configured to facilitate a decision or decide positions (e.g., placements) of electronic components in an IC design and connections (e.g., route) of such components. For instance, P&R module 101 may generate and store in layout log 103 an IC design indicating a via and SADP routes that are accessible by decomposition module 105 and via insertion module 109.

Insertion module 109 is configured to determine a region of a layout for insertion of a redundant or replacement via. As used herein, a redundant via refers to adding a via for establishing a connection of layers already connected by another via and replacement via refers to replacing a first (smaller) via connecting particular layer(s) with a second (larger) via that connects the particular layer(s).

Adverting to FIG. 1A, the insertion module 109 compares a region (e.g., adjacent to a via) in layout in log 103 to a pre-determined region 113 and inserts a redundant or replacement via in layout log 103 based on the comparison to improve a manufacturability of a design. As shown, the via insertion is done during a P&R process without decomposition, thereby allowing timing optimization of a resulting design with the inserted via and reducing an overall design cycle time.

Adverting to FIG. 1B, the insertion module 109 compares a region (e.g., adjacent to a via) in layout in log 103 to a pre-determined region 113 and inserts a redundant or replacement via in layout log 111 based on the comparison to improve a manufacturability of a design. As shown, the via insertion is done after a P&R process without decomposition, thereby allowing for a simpler implementation and reducing an overall design cycle time.

Figure 2:
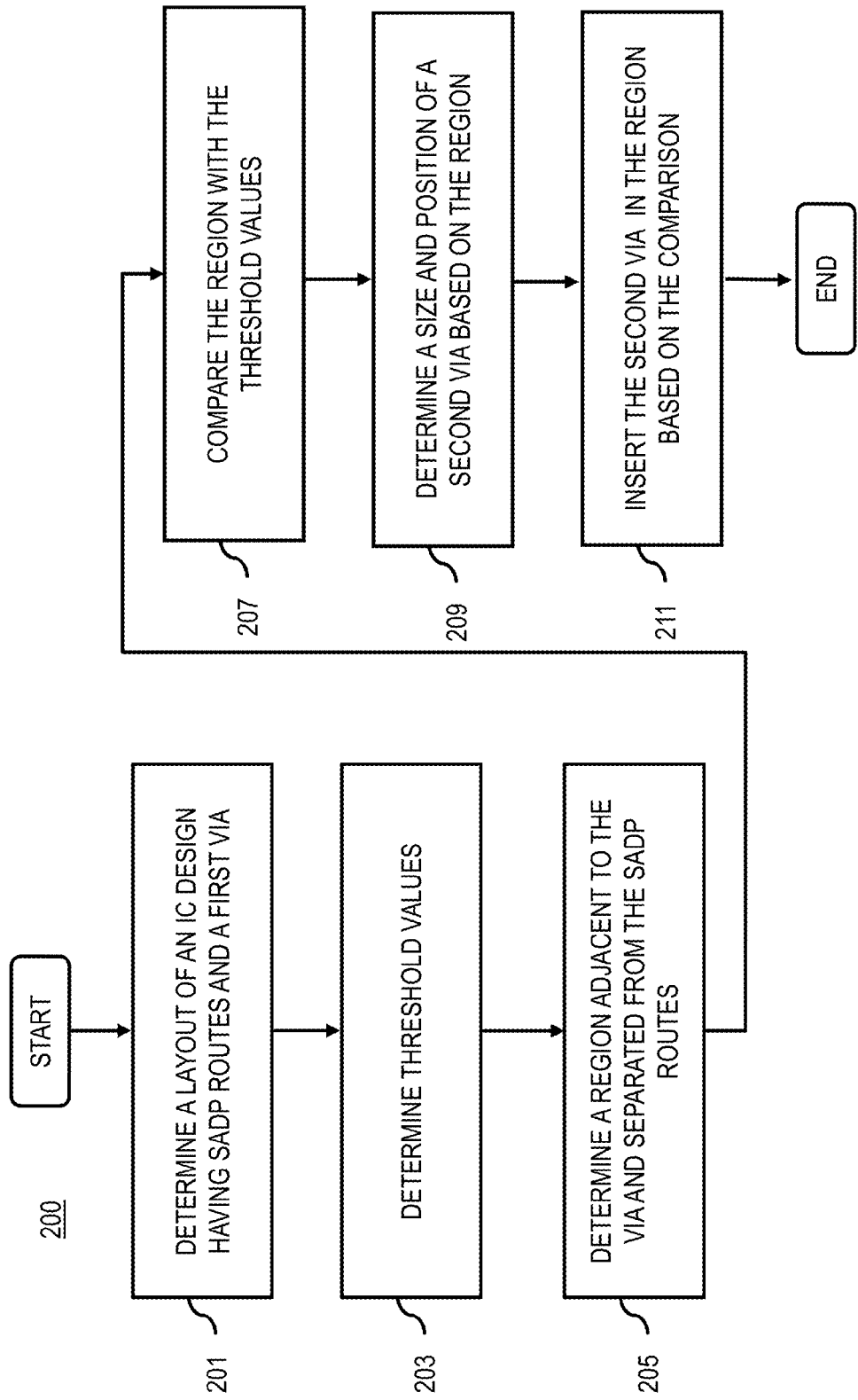
FIG. 2 is a flowchart of a process to insert a via in accordance with an exemplary embodiment.

Adverting to FIG. 2, in accordance with exemplary embodiments, a flowchart illustrates a process for inserting vias. For illustrative purpose, process 200 is described with respect to the system of FIG. 1A. It is noted that the steps of process 200 may be performed in any suitable order, as well as combined or separated in any suitable manner. For instance, step 209 may be omitted.

In step 201, P&R module 101 determines a layout of an IC design stored in log 103 having SADP routes and a first via. In step 203, the insertion module 109 determines threshold values. For example, the insertion module 109 accesses and/or determines a pre-defined horizontal width 'X', and a pre-defined vertical height 'Y' using the following equations:

$$X = 2 * \min(\text{blockmask}CD\_x) + \min(\text{metalExtension}\_x)$$

$$Y = \min(\text{blockmask}CD\_y) + \min(\text{metalExtension}\_y)$$

where blockmaskCD_x denotes a horizontal width of a critical distance of a block mask, and metalExtension_x denotes a horizontal width of a metal extension for a via bar and where blockmaskCD_y denotes a vertical height of a critical distance of a block mask, and metalExtension_y denotes a vertical height of a metal extension for a via bar. The pre-defined values 'X' and 'Y' may be determined in real-time, or predetermined to a P&R step and/or a decomposition step. Additionally, a tolerance (not shown) may be added to the pre-defined values 'X' and 'Y'.

Next, the insertion module 109 determines, as in step 205, a region adjacent to the via and separated from the SADP routes. For example, the insertion module 109 identifies a region extending in one vertical direction from the via, and extending in both horizontal directions away from a midpoint of the via. The region may be any shape, for example, a polygon, circle, square, and the like.

Next, the insertion module 109 compares, as in step 207, the region with the threshold values. For example, the insertion module 109 determines whether the following equation is satisfied:

$$\min(d_x) > X$$

$$\min(h_y) > Y$$

where $d_x$ denotes horizontal widths of the region, 'X' denotes the pre-defined horizontal width, and where $b_y$ denotes vertical heights of the region and 'Y' denotes the pre-defined vertical height.

Additionally, or alternatively, the insertion module 109 determines whether the following equations are satisfied:

$$\min(d_x) > 2 * \min(\text{blockmask}CD_x) + \min(\text{metalExtension}_x)$$

$$\min(h_y) > \min(\text{blockmask}CD_y) + \min(\text{metalExtension}_y)$$

where $d_x$ denotes horizontal widths of the region, blockmaskCD$_x$ denotes horizontal widths of critical distances of block masks, and metalExtension$_x$ denotes horizontal widths of metal extensions for various via bar, and where $b_y$ denotes vertical heights of the region, blockmaskCD$_y$ denotes vertical heights of critical distances of block masks, and metalExtension$_y$ denotes vertical heights of metal extensions for various via bars.

Next, in step 209, the insertion module 109 determines a size and position of a second via based on the region. For example, the insertion module 109 selects one of a plurality of sets of 'X' and 'Y' (or blockmaskCD$_x$, metalExtension$_x$, blockmaskCD$_y$, metalExtension$_y$) that most closely satisfies the equations in step 207.

In step 211, the insertion module 109 inserts the second via in the region based on the comparison. For instance, if the equations of step 207 are satisfied, the insertion module 109 inserts the via associated with the pre-defined values 'X' and 'Y' in step 207 (or the via determined in step 209) in the region and stores the resulting modified layout in log 103 (or layout log 111). The processes of FIG. 2 may be performed multiple times on a single IC design. For instance, steps 205 through 211 may be performed for each via in an IC design. As such, each via having an adjacent region satisfying the equations of step 207 may have a corresponding redundant or replacement via to improve manufacturability of a resulting device.

Figure 3:
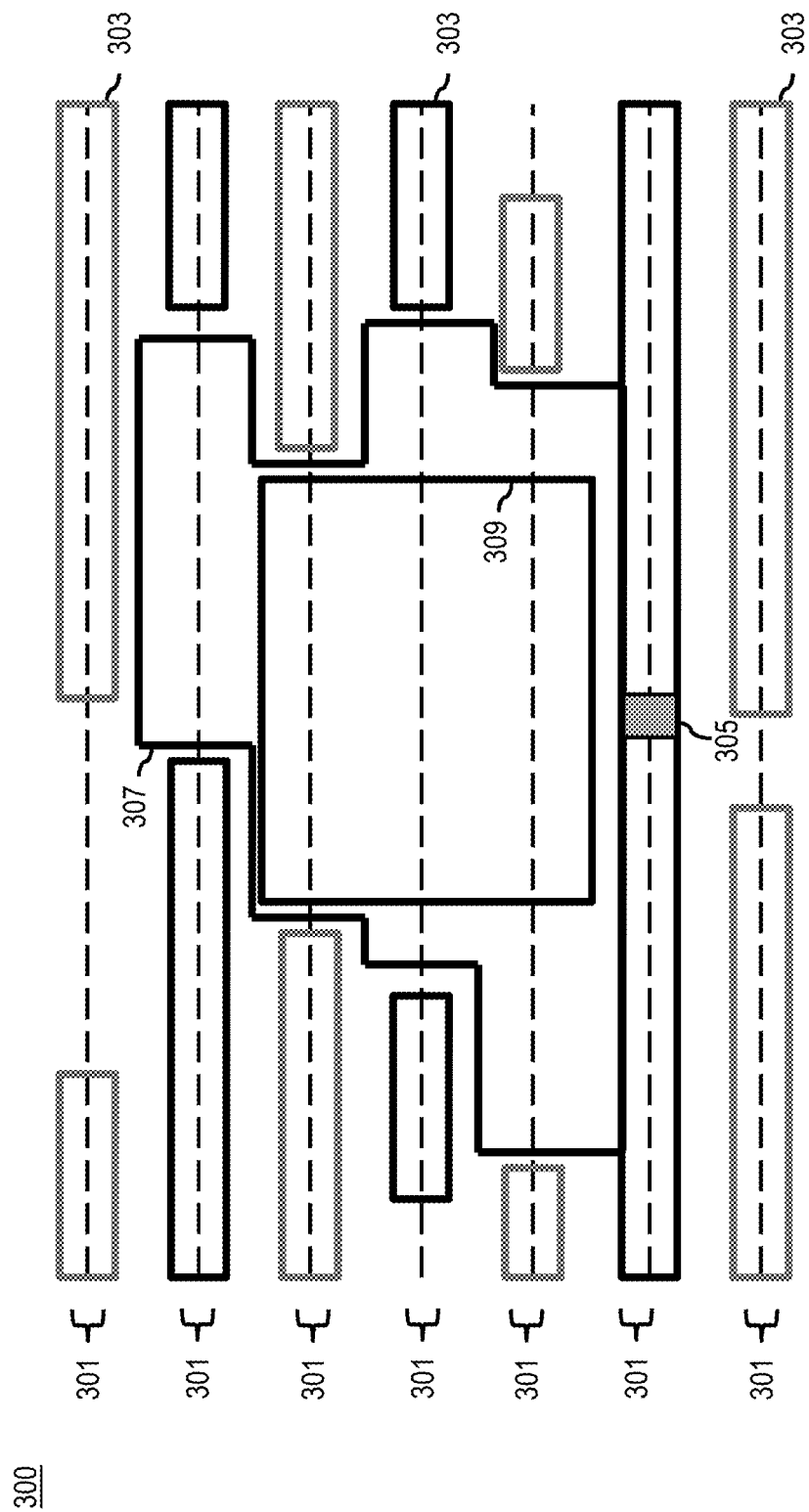
FIG. 3 is a flowchart of an additional process to insert a via in accordance with an exemplary embodiment.

FIGS. 3 through 5 and 6A illustrate a process to insert a redundant via, in accordance with an exemplary embodiment. Additionally, FIGS. 3 through 5 and 6B illustrate a process to insert a replacement via, in accordance with an exemplary embodiment. For illustrative purpose, the processes are described with respect to the systems of FIGS. 1A and 1B. It is noted that the steps of the process may be performed in any suitable order, as well as combined, omitted, or separated in any suitable manner FIGS. 3 through 5, 6A, and 6B include an IC layout 300, for example, stored in layout log 103, and provided with alternating mandrel and non-mandrel SADP tracks 301 having on-track features 303, and via 305. FIG. 3 illustrates an exemplary region 307 adjacent to a via and separated from the SADP routes. Additionally, the region 307 may be reduced to form a particular predefined shape such as a rectangle 309, square (not shown), circle (not shown), and the like.

Figure 4:
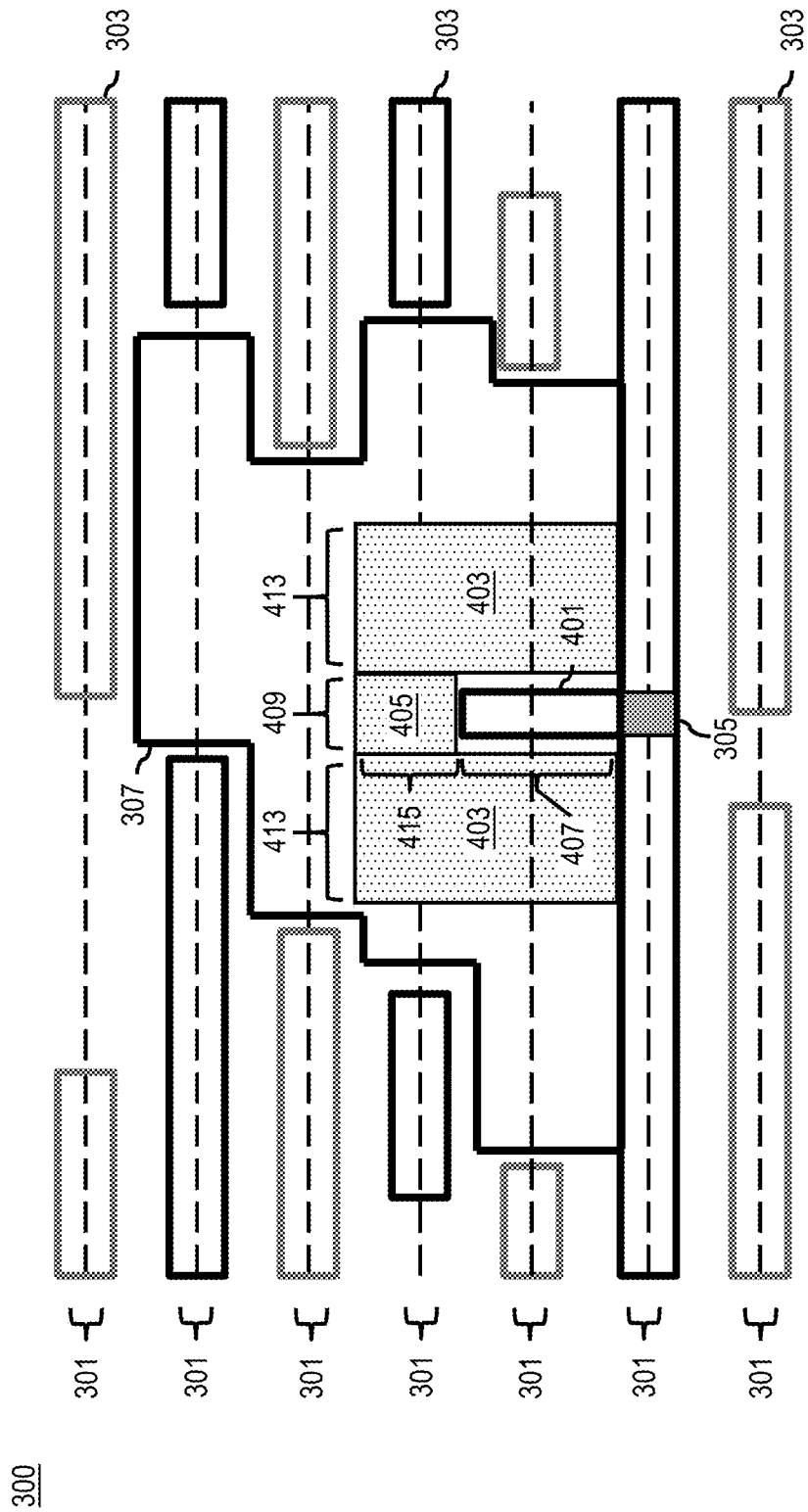
FIGS. 4 through 5 and 6A illustrate a process to insert a redundant via in accordance with an exemplary embodiment.
Figure 5:
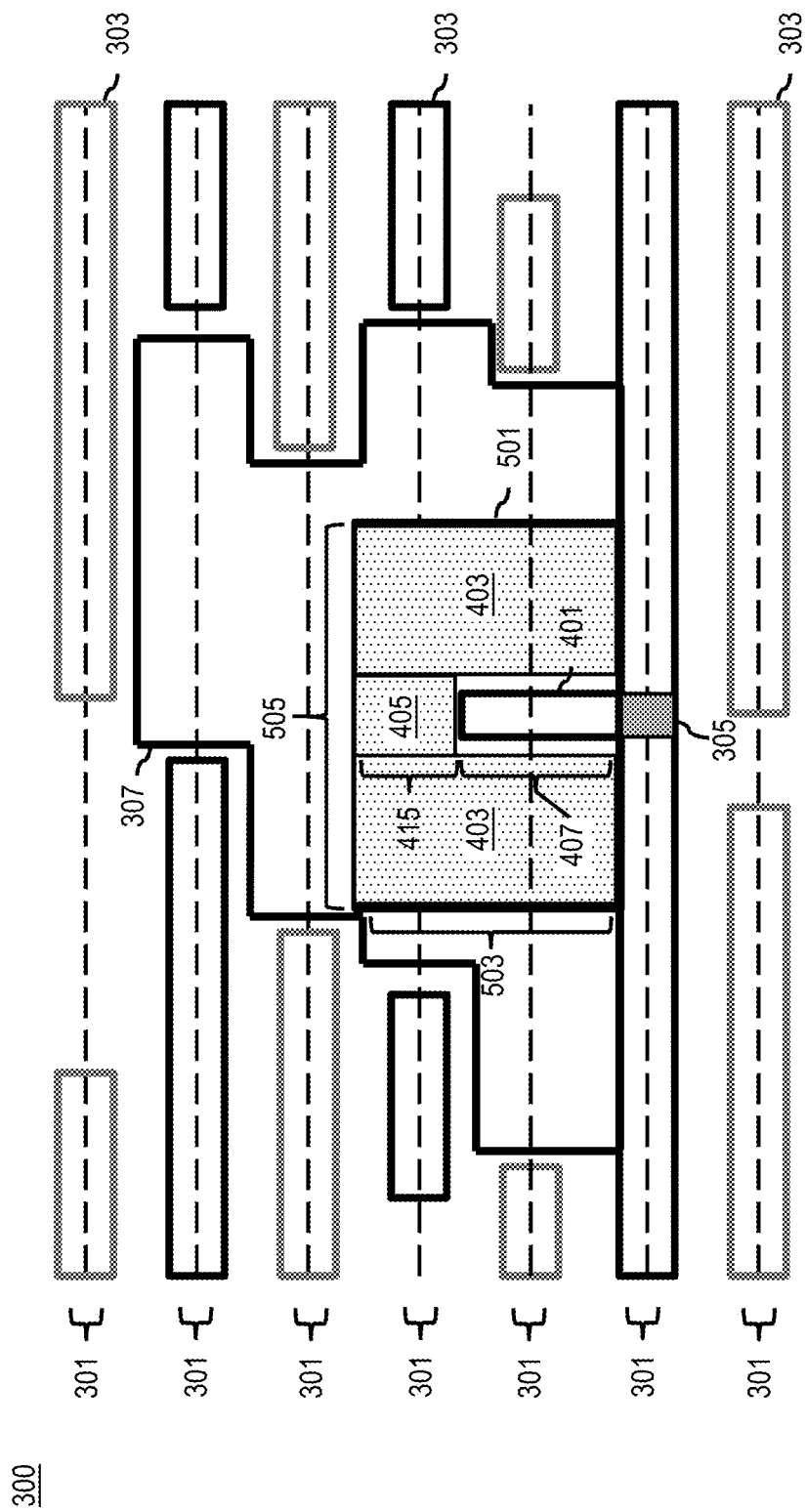

Adverting to FIG. 4, insertion module 109 determines a set of threshold values. As shown, the set of threshold values are based on a metal extension 401, and block masks 403 and 405 of log 107. The metal extension 401 has a height 407 equal to metalExtension$_y$ and a width 409 equal to metalExtension$_x$. Additionally, block masks 403 each have a width 413 equal to blockmaskCD$_x$ and block mask 405 has a height 415 equal to blockmaskCD$_y$. FIG. 5 illustrates a resulting rectangular region 501 having a height 503 and width 505 within the region 307. As discussed above, rectangular region 501 (and height 503 and width 505) may be pre-determined.

Figure 6A:
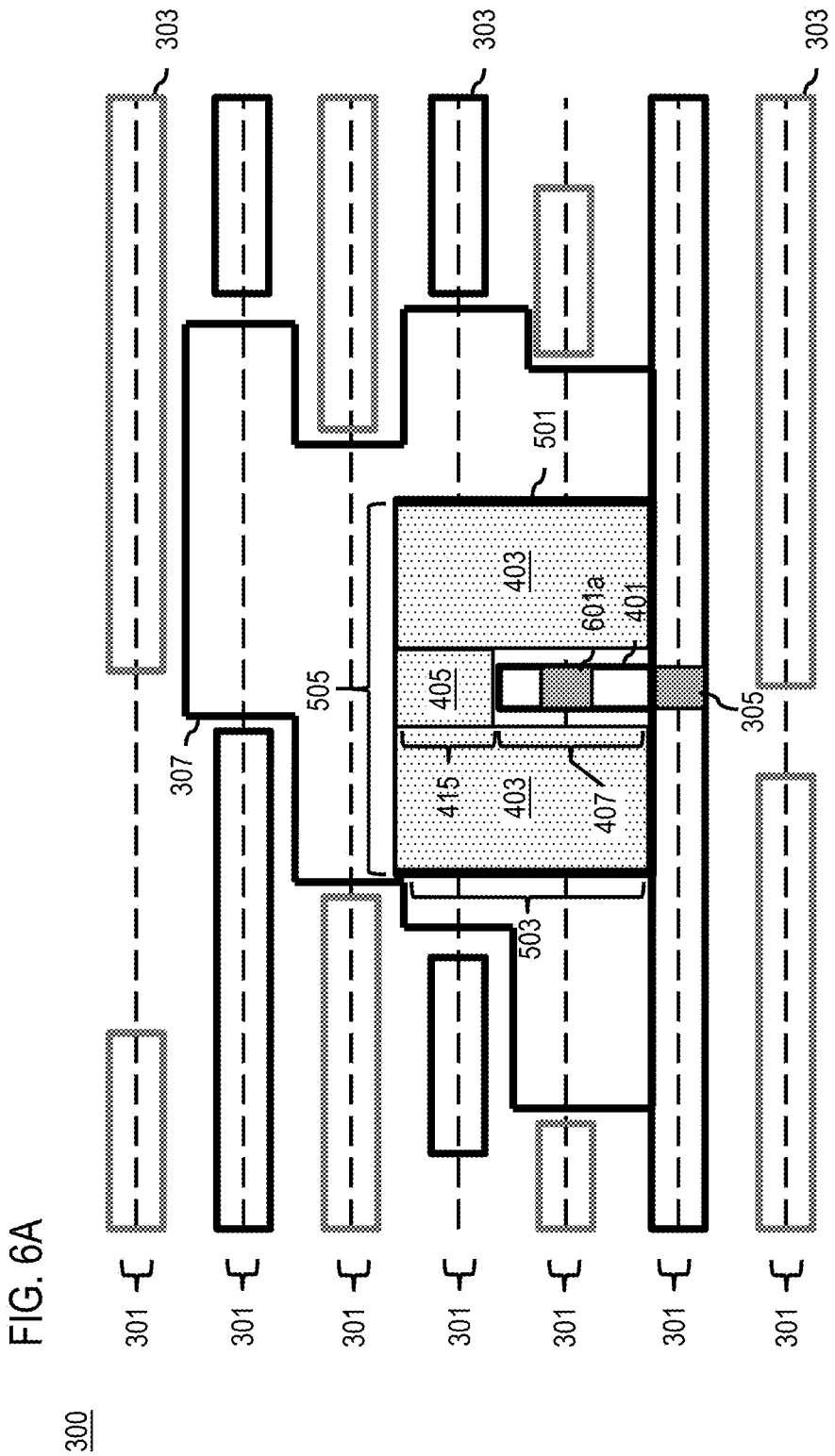

Adverting to FIG. 6A, a second via 601a is inserted in the metal extension 501 to redundantly connect M1 and M2 layers connected by via 305. As such, via 601a preserves a functionality of a resulting device when via 305, due to manufacturing tolerances, fails to connect the intended layers in the resulting device. Additionally, the metal extensions can be inserted in either the M1 or M2 layers, thereby allowing a selection of M1 or M2 for insertion of the metal extension, for instance, based on an availability of space in each layer. The redundant via 601a may be the same size, as shown in FIG. 6A, or may be smaller (not shown) or larger (not shown) than via 305.

Alternatively, FIG. 6B shows a determination of a set of threshold values. As shown, the set of threshold values includes second metal extensions 603, and second block masks 605 and 607 of log 107, resulting in a rectangular region 609 having a height 611 and width 613. As similarly noted above, the threshold values may be pre-determined regions such as the rectangular region 609 (and height 611 and width 613). As the rectangular region 609 utilizes more of the IC design layout while being within the region 307, a larger via 601b may be utilized to replace the original via 305 to provide further manufacturability of a resulting design than the via 601a. Redundant via 601a may similarly be sized and positioned based on the region. Furthermore, vias 601a and 601b as shown in FIGS. 6A and 6B, respectively, may be formed by block masks to ensure compliance with two-dimensional metal rules without a DRC compliance check, thereby improving a manufacturability of a design without significantly increasing an overall design cycle time.

Adverting to FIGS. 7 and 8, metal extension 401 is formed by a mandrel. As shown, a mandrel-to-mandrel distance 701 (e.g., tip-to-tip) is less than a minimum mandrel-to-mandrel space. Adverting to FIG. 8, a dummy mandrel 801 is utilized to allow the features to be decomposable, even when a mandrel-to-mandrel distance (e.g., tip-to-tip) is less than a minimum mandrel-to-mandrel space. Specifically, the dummy mandrel 801 including some of the features 303 and the metal extension 401 thus results in no violation of a minimum mandrel-to-mandrel space. Furthermore, block masks 403 and 405 remove unwanted portions of the dummy mandrel to form the features 303 and 401. As such, the steps illustrated in FIGS. 7 and 8 ensure a decomposability and generation of the feature 303 and metal extension 401 without a two-dimensional SADP DRC or color information (e.g., mandrel-to-mandrel, mandrel-to-non-mandrel, non-mandrel-to-non-mandrel, etc.) Therefore, the steps allow use of dummy mandrel metals and block masks to enable a formation of mandrel metal features even when a mandrel-to-mandrel distance (e.g., tip-to-tip) is less than a minimum mandrel-to-mandrel space. It is noted that steps illustrated in FIGS. 7 and 8 may also be utilized to form a replacement via (e.g., via 601b).

Figure 9:
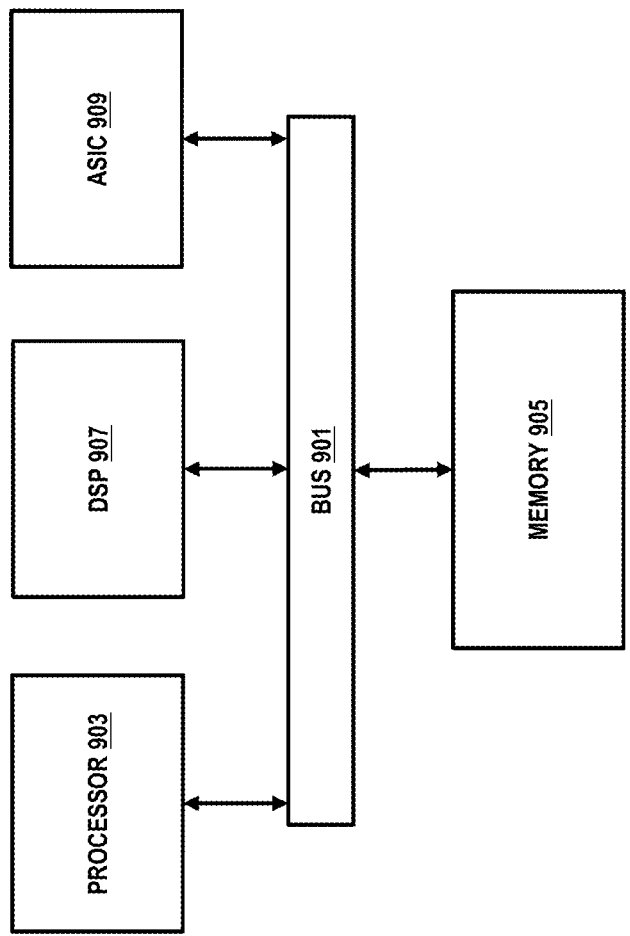
FIG. 9 is a diagram of a chip set that can be used to implement exemplary embodiments.

FIG. 9 is a diagram of a chip set that can be used to implement various exemplary embodiments. Chip set 900 is programmed to determine a region to insert a via as described herein and includes, for instance, the processor and memory components described with respect to FIG. 9 incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in exemplary embodiments the chip set can be implemented in a single chip. Chip set 900, or a portion thereof, constitutes a means for performing one or more steps of FIGS. 1 through 8.

The chip set 900 may include a communication mechanism such as a bus 901 for passing information among the components of the chip set 900. A processor 903 has connectivity to the bus 901 to execute instructions and process information stored in, for example, a memory 905. The processor 903 may include one or more processing cores with each core configured to perform independently. A multi-core processor enables multiprocessing within a single physical package. Examples of a multi-core processor include two, four, eight, or greater numbers of processing cores. Alternatively, or in addition, the processor 903 may include one or more microprocessors configured in tandem via the bus 901 to enable independent execution of instructions, pipelining, and multithreading. The processor 903 may also be accompanied by one or more specialized components to perform certain processing functions and tasks such as one or more digital signal processors (DSP) 907, or one or more application-specific integrated circuits (ASIC) 909. A DSP 907 typically is configured to process real-world signals (e.g., sound) in real time independently of the processor 903. Similarly, an ASIC 909 can be configured to performed specialized functions not easily performed by a general purposed processor. Other specialized components to aid in performing the inventive functions described herein include one or more field programmable gate arrays (FPGA) (not shown), one or more controllers (not shown), or one or more other special-purpose computer chips.

The processor 903 and accompanying components have connectivity to the memory 905 via the bus 901. The memory 905 includes both dynamic memory (e.g., RAM, magnetic disk, writable optical disk, etc.) and static memory (e.g., ROM, CD-ROM, etc.) for storing executable instructions that when executed perform the inventive steps described herein. The memory 905 also stores the data associated with or generated by the execution of the inventive steps.

The embodiments of the present disclosure can achieve several technical effects including an insertion of vias, resulting in an improved manufacturability of a resulting design. The present disclosure enjoys industrial applicability in any of various types of highly integrated semiconductor devices, particularly in IC devices utilizing SADP technology.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   determining a layer of a substrate of an integrated circuit (IC) design having a first via and a plurality of routes, the plurality of routes extending horizontally on the substrate and placed on one of a plurality of equally spaced vertical positions;
   comparing, via at least one processor, a region of the layer extending vertically between a first set of the plurality of routes and extending horizontally between a second set of the plurality of the routes with one or more threshold values, the region being adjacent to the first via and being separated from the plurality of routes; and
   inserting a second via based on the comparison.

2. The method according to claim 1, wherein the one or more threshold values include a predetermined height and width and the comparison further comprises:
   determining a rectangular region adjacent to the first via and extending at least the predetermined height from an outer edge of the first via, the rectangular region having a width of at least the predetermined width; and
   comparing the region with the rectangular region, wherein the second via is inserted in the rectangular region and based further on the comparison of the region with the rectangular region.

3. The method according to claim 2, wherein the rectangular region extends the predetermined height from the outer edge and the width equals the predetermined width.

4. The method according to claim 1 comprising:
   determining a vertical distance between an outer edge of the first via and one of the first set of routes;
   determining a first horizontal distance between a horizontal midpoint of the first via and one of the second set of routes along a first horizontal direction; and
   determining a second horizontal distance between the horizontal midpoint of the first via and one of the second set of routes along the other horizontal direction, wherein the region is at least a portion of a rectangular region extending vertically by the vertical distance from the outer edge of the first via and having a width equal to the sum of the first and second horizontal distances.

5. The method according to claim 4, wherein the one or more threshold values includes a predetermined height and width, and the comparison further comprises:
   comparing the vertical distance with the predetermined height; and
   comparing the first and second horizontal distances with the predetermined width, wherein the second via is inserted in the rectangular region and based further on the comparison of the vertical distance with the predetermined height and the comparison of the first and second horizontal distances with the predetermined width.

6. The method according to claim 5, comprising:
   determining a size of the second via based on a size of the rectangular region.

7. The method according to claim 1, wherein the layer is a M1 or M2 layer of the IC design and the first and second vias are a connection between the layer and another layer of the IC design, a pin access, or a metal transition region.

8. The method according to claim 1 comprising:
   determining a minimum region for inserting the second via; and
   determining a critical distance associated with a mask generating the route, the first via, the second via, or a combination thereof, wherein the one or more threshold values are based on the minimum region and the critical distance.

9. An apparatus comprising:
   at least one processor; and
   at least one memory including computer program code for one or more programs,
   the at least one memory and the computer program code configured to, with the at least one processor, cause the apparatus to perform at least the following,
   determine a layer on a substrate of an integrated circuit (IC) design having a first via and a plurality of routes, the plurality of routes extending horizontally on the substrate and placed on one of a plurality of equally spaced vertical positions;
   compare a region of the layer extending vertically between a first set of the plurality of routes and extending horizontally between a second set of the plurality of the routes with one or more threshold values, the region being adjacent to the first via and being separated from the plurality of routes; and
   insert a second via based on the comparison.

10. The apparatus according to claim 9, wherein the one or more threshold values include a predetermined height and width and the comparison further comprises:
    determining a rectangular region adjacent to the first via and extending at least the predetermined height from an outer edge of the first via, the rectangular region having a width of at least the predetermined width; and
    comparing the region with the rectangular region, wherein the second via is inserted in the rectangular region and based further on the comparison of the region with the rectangular region.

11. The apparatus according to claim 10, wherein the rectangular region extends the predetermined height from the outer edge and the width equals the predetermined width.

12. The apparatus according to claim 9, wherein the apparatus is further caused to:
    determine a vertical distance between an outer edge of the first via and one of the first set of routes;
    determine a first horizontal distance between a horizontal midpoint of the first via and one of the second set of routes along a first horizontal direction; and
    determine a second horizontal distance between the horizontal midpoint of the first via and one of the second set of routes along the other horizontal direction, wherein the region is at least a portion of a rectangular region extending vertically the vertical distance from the outer edge of the first via having a width of the first and second horizontal distances.

13. The apparatus according to claim 12, wherein the one or more threshold values includes a predetermined height and width, and the comparison further comprises:
    comparing the vertical distance with the predetermined height; and
    comparing the first and second horizontal distances with the predetermined width, wherein the second via is inserted in the rectangular region and based further on the comparison of the vertical distance with the predetermined height and the comparison of the first and second horizontal distances with the predetermined width.

14. The apparatus according to claim 13, wherein the apparatus is further caused to:
    determine a size of the second via based on a size of the rectangular region.

15. The apparatus according to claim 9, wherein the layer is a M1 or M2 layer of the IC design and the first and second vias are a connection between the layer and another layer of the IC design, a pin access, or a metal transition region.

16. The apparatus according to claim 9, wherein the apparatus is further caused to:
    determine a minimum region for inserting the second via; and
    determine a critical distance associated with a mask generating the route, the first via, the second via, or a combination thereof, wherein the one or more threshold values are based on the minimum region and the critical distance.

17. A method comprising:
    determining a M1 or M2 layer on a substrate of an integrated circuit (IC) design having a first via and a plurality of routes, the plurality of routes extending horizontally on the substrate and placed on one of a plurality of equally spaced vertical positions being separated by a distance, and the first via being a connection between the M1 or M2 layer and another M1 or M2 layer of the IC design, a pin access, or a metal transition region;
    determining a first region of the M1 or M2 layer extending vertically between a first set of the plurality of routes and extending horizontally between a second set of the plurality of the routes for inserting a second via, the region being adjacent to the first via with one or more threshold values and being separated from the plurality of routes;
    determining a minimum region for inserting the second via;
    determining a critical distance associated with a mask generating the route, the first via, the second via, or a combination thereof;
    determining a predetermined height and width based on the minimum region and the critical distance;
    comparing, via at least one processor, the first region with the predetermined height and width; and
    inserting the second via in the region based on the comparison.

18. The method according to claim 17, comprising:
    determining a rectangular region adjacent to the first via and extending the predetermined height from an outer edge of the first via, the rectangular region having a width of the predetermined width; and
    comparing the first region with the rectangular region, wherein the second via is inserted in the rectangular region and based further on the comparison of the region with the rectangular region.

19. The method according to claim 17, comprising:
    determining a vertical distance between an outer edge of the first via and one of the first set of routes;
    determining a first horizontal distance between a horizontal midpoint of the first via and one of the second set of routes along a first horizontal direction;
    determining a second horizontal distance between the horizontal midpoint of the first via and one of the second set of routes along the other horizontal direction, wherein the region is a rectangular region extending vertically the vertical distance from the outer edge of the first via and having a width of the first and second horizontal distances;
    comparing the vertical distance with the predetermined height; and
    comparing the first and second horizontal distances with the predetermined width, wherein the insertion of the second via is further based on the comparison of the vertical distance with the predetermined height and the comparison of the first and second horizontal distances with the predetermined width.

20. The method according to claim 19, comprising determining a size of the second via based on a size of the rectangular region.

* * * * *